United States Patent [19]
Austin et al.

[11] Patent Number: 5,472,804
[45] Date of Patent: Dec. 5, 1995

[54] BATTERY DEVICE WITH INTEGRATED CIRCUIT SUBSTRATE PACKAGING

[75] Inventors: Micheal M. Austin, Lilburn; Steven R. Fischl, Lawrenceville, both of Ga.

[73] Assignee: Motorola, Inc., Schaumburg, Ill.

[21] Appl. No.: 347,734

[22] Filed: Dec. 1, 1994

[51] Int. Cl.⁶ .................................................. H01M 2/10
[52] U.S. Cl. ............................ 429/99; 429/7; 429/96
[58] Field of Search ............................ 429/96, 97, 123, 429/7, 99

[56] References Cited

U.S. PATENT DOCUMENTS

| | | | |
|---|---|---|---|
| 1,176,467 | 3/1916 | Koretzky | 429/99 |
| 3,992,225 | 11/1976 | Sykes | 429/99 |
| 4,586,260 | 5/1986 | Baxter et al. | 33/125 |
| 4,709,202 | 11/1987 | Koenck | 320/43 |
| 4,939,792 | 7/1990 | Urbish et al. | 455/347 |
| 5,096,788 | 3/1992 | Bresin et al. | 429/99 |
| 5,197,889 | 3/1993 | Rizzo et al. | 439/76 |
| 5,250,371 | 10/1993 | Kleinert, III et al. | 429/99 |
| 5,302,110 | 4/1994 | Desai et al. | 429/96 |
| 5,358,798 | 10/1994 | Kleinert et al. | 429/7 |

*Primary Examiner*—Prince Willis, Jr.
*Assistant Examiner*—Carol Chaney
*Attorney, Agent, or Firm*—Andrew S. Fuller

[57] ABSTRACT

A battery device (100) has integral circuit substrate packaging. The battery device (100) has one or more energy cells (122), and a substrate (105) having an integral battery circuit (130) electrically coupled to the one or more energy cells (122). The substrate (105) forms a housing for the one or more energy cells (122).

21 Claims, 3 Drawing Sheets

BATTERY DEVICE WITH INTEGRATED CIRCUIT SUBSTRATE PACKAGING

TECHNICAL FIELD

This invention relates in general to battery devices, such as those used in electronic products, and more particularly, to the structure and packaging of battery devices.

BACKGROUND OF THE INVENTION

Portable electronic products, such as portable radios, cellular phones, and the like, have become increasingly smaller and lighter in weight. However, the market for these products demand even smaller and lighter designs. A significant component of the overall size and weight of a high powered device, such as a cellular phone or a two-way radio transceiver, is the size and weight of their batteries. Battery designs which offer a reduction in weight and size are constantly in demand. For example, in the case of lightweight cellular phones, weight advantages are measured in ounces or grams, and are heavily touted in marketing campaigns. Accordingly, any appreciable reduction in size and/or weight of battery devices which gives a competitive edge in the market place is considered significant.

Many portable electronic products use rechargeable battery packs as a primary power source. These battery packs tend to house one or more energy cells, as well as battery circuitry for controlling the recharging of the battery, and for the provision of smart battery functions. The battery circuitry, including associated electrical components, are typically implemented on a circuit carrying substrates such as a printed circuit board or flexible film substrate. Generally, the battery packs are housed in a case formed from a rigid material such as plastic or metal. The housing seals and protects the energy cells, the internal battery circuitry, and associated electrical components. Battery contacts, soldered to the circuit carrying substrate, affixed to the housing, or otherwise, provide access to the energy cells and battery functions. The packaging and support components for the battery represent a significant portion of the overall battery weight.

It is desirable to be able to offer battery powered portable electronic products with size and weight advantages over competitive products. Efforts to reduce the size and weight of the energy cells while improving or retaining power output capabilities are constant. Additionally, the potential weight savings from other components of the battery device can be significant. Therefore, there is a need to provide a battery device which offers a reduction in size and weight.

DETAILED DESCRIPTION OF THE PREFERRED EMBODIMENT

Figure 1:
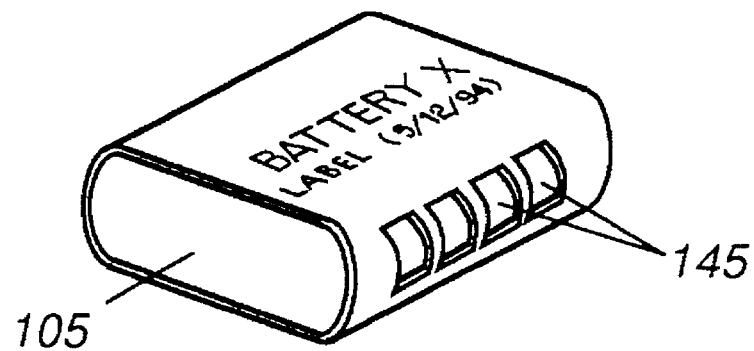
FIG. 1 is a circuit substrate packaged battery device, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides for a battery device with integrated circuit substrate packaging, which provides significant cost, size, and weight advantages over prior art battery devices. In a preferred embodiment, a circuit carrying substrate forms a housing for one or more energy cells. The substrate carries an integral battery circuit which is electrically coupled to the energy cells. Preferably, the substrate is formed from flexible thin film material, thereby providing for packaging which minimizes cost, size, and weight.

Figure 2:
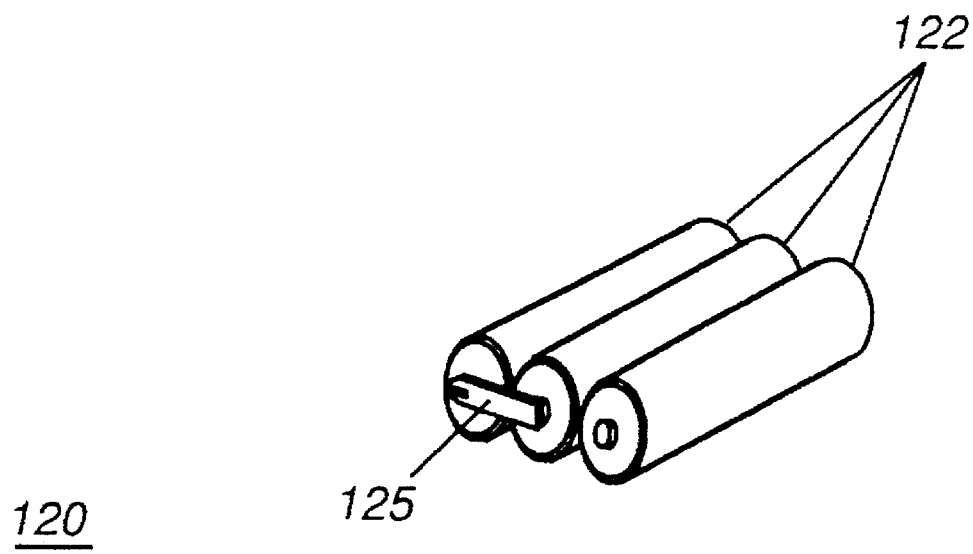
FIG. 2 is a set of electrically coupled energy cells, in accordance with the present invention.
Figure 3:
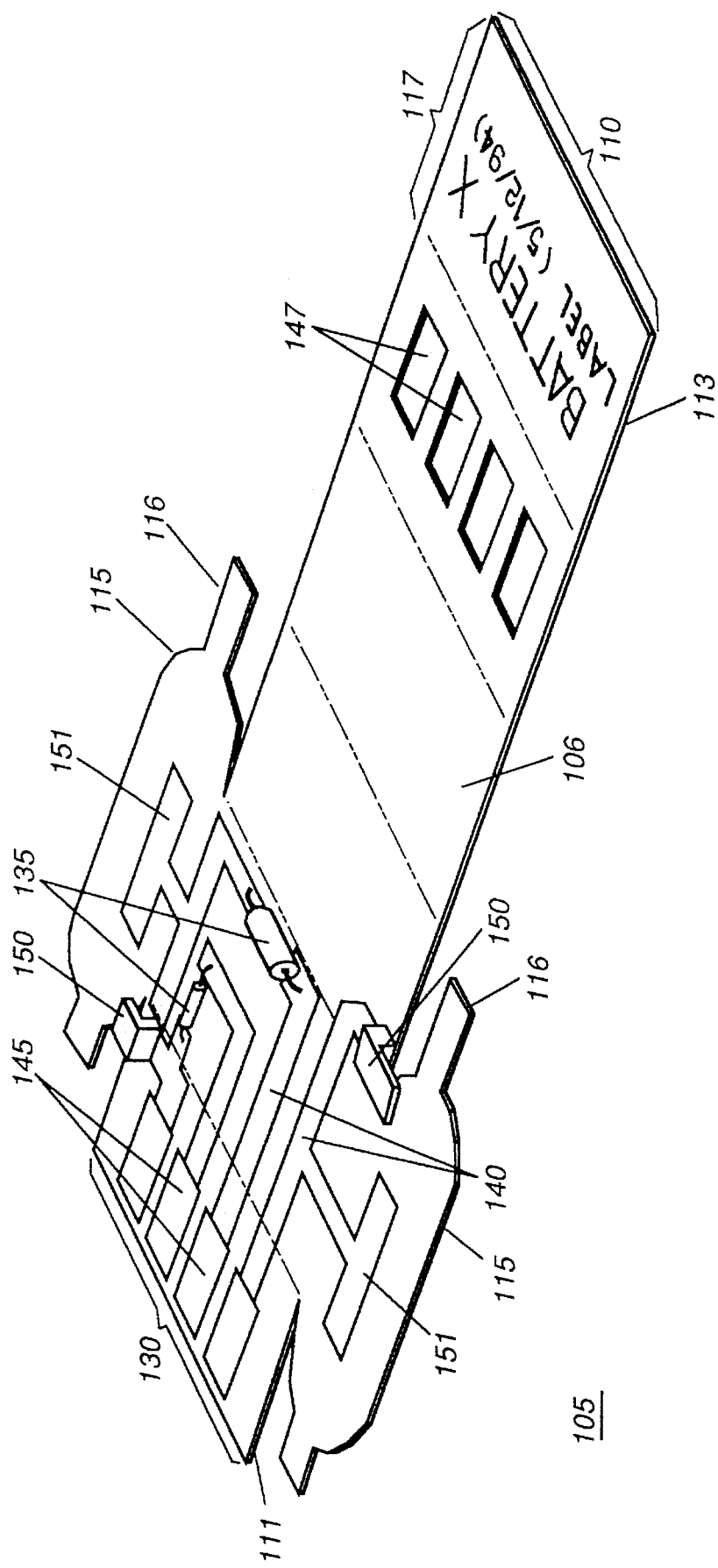
FIG. 3 is a circuit carrying substrate having an integral battery circuit, and integral external electrical contacts, in accordance with the present invention.

FIG. 1 shows a circuit substrate packaged battery device 100, in accordance with the present invention. The battery device 100 is packaged in a flexible film substrate ("flex circuit") 105, which has exposed conductive areas 145 that are plated to form external electrical contacts for the battery device 100. FIGS. 2 and 3 show the major components of the battery device of FIG. 1. FIG. 2 shows multiple energy cells, or battery cells 122, which are electrically coupled to each other by a metal connector 125 to form a battery cell pack 120. The battery cells 122 may be otherwise secured to each other. In the preferred embodiment, there are three cylindrical nickel cadmium, or nickel metal hydride, rechargeable energy storage cells 122, which are commonly available. However, the number and chemistry of energy cells may vary without detracting from the present invention.

FIG. 3 shows the flexible film substrate 105 which carries or houses an integral battery circuit 130, including electrical components 135 such as thermistors, switches, and other components. The substrate 105 is made from insulating material 106, such as polyester or polyimide, or other material commonly used to manufacture flexible film substrates. A conductive pattern 140, ordinarily made from highly conductive metal, such as copper, is embedded or disposed between layers of the insulating flexible film substrate material 106. The embedded conductive pattern 140 provides circuit traces that interconnect the electrical components 135 to form, or at least partially define, the battery circuit 130. Generally, the conductive pattern 140 is insulated by the flexible substrate material 106. However, portions of the conductive pattern 140 are exposed, i.e., without insulation, and are shaped to define external electrical contacts, and more particularly, external battery contacts 145. Preferably, these uninsulated portions 145 of the conductive pattern 140 are plated to provide more robust battery contacts.

The flex circuit 105 is formed to wrap around the cell pack 120 so as to envelop the cell pack 120 when the battery device 100 is assembled. Accordingly, the flex circuit 105 is designed with particular features to aid in this assembly process. For example, the flex circuit 105 has a main portion 110 having an elongated rectangular shape, which houses the battery circuit 130. The battery contacts 145, which are electrically coupled to the battery circuit 130, are located toward one end 111 of the flex circuit 105. The flex circuit 105 also has end flaps 115 with winged portions 116 at either side of the main portion 110 to provide cell end covers when the flex circuit 105 and cell pack 120 are fully packaged. Additionally, the flex circuit 105 has cut through windows or openings 147, which when properly aligned, permit external access to the battery contacts 145 when the flex circuit 105 is wrapped around the cell pack 120. A label area 117 on the flex circuit 105 accommodates label information for the battery device 100. Preferably, the label information is formed using conductive patterns, such as those used for circuit traces. However, other nonconductive patterns can be used to define the label information. The flex circuit 105 has an adhesive disposed on one surface 113, i.e., the surface 113 is adhesively backed, such that the flex circuit 105 can be secured to the cell pack 120. Contact tabs 150 soldered onto designated areas on the flex circuit 105 provide electrical coupling between the flex circuit 105 and terminals of the battery cells 122. Optionally, the electrical coupling between the flex circuit 105 and the battery cells 122, and between battery cells (inter-cell connections), may be provided through uninsulated portions 151 of the conductive pattern on the end flaps 115 of the flex circuit 105.

Figure 4:
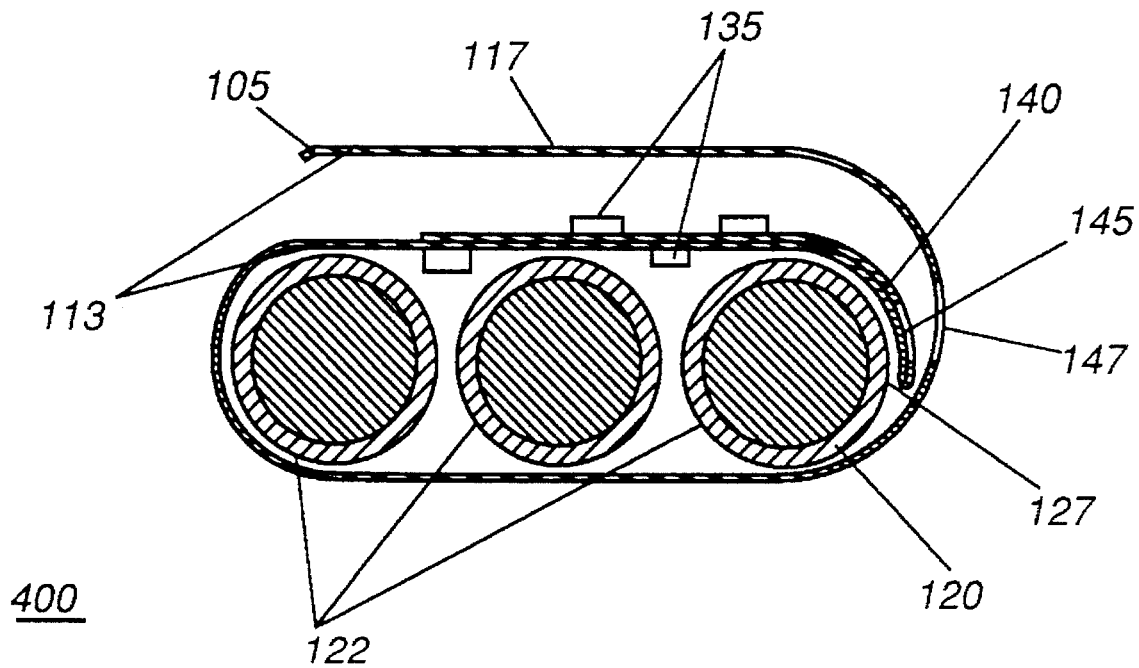
FIG. 4 is a cross sectional view of a battery device in a partially assembled state, in accordance with the present invention.
Figure 5:
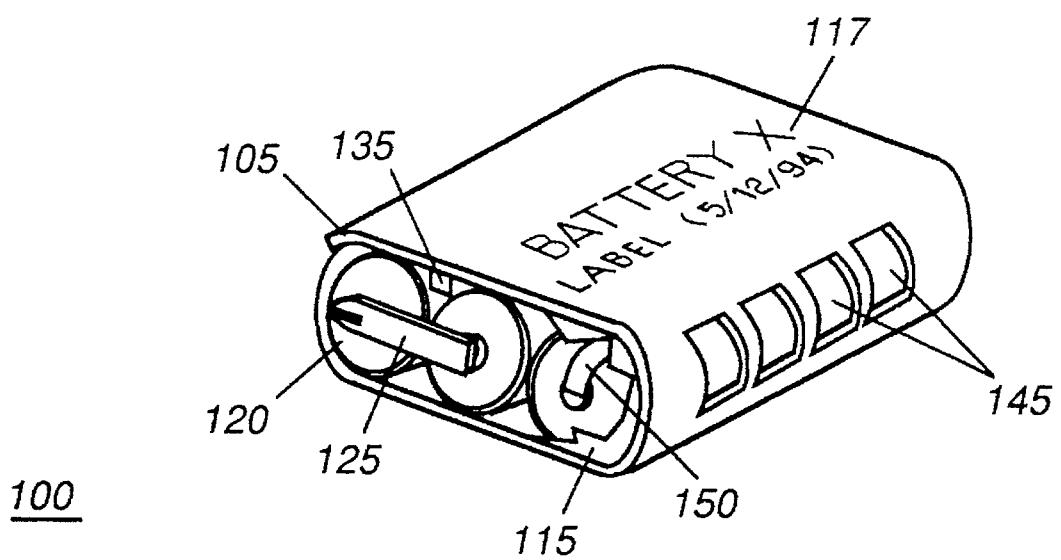
FIG. 5 is a cut-away view of the fully assembled battery device of FIG. 1.

FIG. 4 shows a partially assembled battery device 400, in accordance with the present invention. FIG. 5 shows a cut-away view of the fully assembled battery device 100, in accordance with the present invention. Referring to FIG. 4 and FIG. 5, the present invention provides for simplified assembly of the flex circuit 105 to the battery cell pack 120 to provide a fully packaged battery device 100. In the preferred embodiment, the portion of the flex circuit 105 housing the external battery contacts 145 is located along one side 127 of the cell pack 120. The flex circuit 105 is wrapped or folded to form layers around the cell pack 120 such that the adhesively backed surface 113 engages the cell pack 120 and secures the flex circuit to the cell pack 120. Electrical components 135 forming the battery circuit 130 are interstitially located in the between the battery cells 122 of the cell pack 120, alongside the cell pack 120, or between folded layers of the flex circuit 105. The flex circuit 105 is wrapped such that the battery contacts 145 are aligned with the cut through windows 147 on the substrate to provide external access to the battery contacts 145 through portions of the substrate. Preferably, the end flaps are secured to the ends of the cell pack 120 such that as the main portion 110 of the flex circuit 105 is wrapped around the cell pack 120, the main portion 110 engages the winged portion of the end flaps to help secure the end flaps to the cell pack 120. Note that the flex circuit 105 is wrapped around the cell pack 120 and the end cover secured, so as to envelop the cell pack 120. Additionally, the label area 117 is located to form a portion of the exterior surface of the battery device 100.

In summary, the present invention provides for a battery device 100 packaged to offer a significant reduction in size and weight. The battery device 100 includes a cell pack 120, having one or more battery cells 122, with a circuit substrate housing 105. Preferably, the substrate 105 is a flexible thin film circuit housing battery circuitry 130, and battery contacts 145 formed from plated uninsulated portions of the conductive pattern 140 or circuit traces. The cell pack 120 provides a partially rigid structural backing for the battery contacts 145 of the substrate. The substrate 105 envelops, or substantially envelops, the cell pack 120 to provide protective covering for the internal components 135 of the battery device 100. The substrate 105, together with the cell pack 120, forms a substantially rigid structure.

The battery device, according to the present invention, offers substantial advantages over the prior art. By using the circuit carrying substrate as a device housing, structural components, typically found in the prior art, are eliminated, thus avoiding the associated costs, size and weight. Additionally, assembly is simple and straight forward, thus potentially reducing manufacturing time and costs.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A battery device with integral circuit substrate packaging, comprising:

at least one energy cell; and a flexible film substrate circuit tarrying substrate having an integral battery circuit electrically coupled to the at least one energy cell, the substrate forming a housing for the at least one energy cell.

2. The battery device of claim 1, further comprising a plurality of battery contacts being disposed on the substrate, and being electrically coupled to the integral battery circuit.

3. The battery device of claim 2, wherein the substrate comprises an insulated conductive pattern having portions thereof without insulation to at least partially define the battery contacts.

4. A battery device with integral circuit substrate packaging, comprising:

at least one energy cell; and a substrate having an integral battery circuit electrically coupled to the at least one energy cell, the substrate forming a housing for the at least one energy cell;

wherein the substrate substantially envelops the at least one energy cell, and provides insulation for the integral battery circuit.

5. A battery device with integral circuit substrate packaging, comprising:

at least one energy cell; and a substrate having an integral battery circuit electrically coupled to the at least one energy cell, the substrate forming a housing for the at least one energy cell;

wherein the substrate is adhesively attached to the at least one energy cell.

6. The battery device of claim 1, wherein the substrate provides structural support for the at least one energy cell, and for the integral battery circuit.

7. The battery device of claim 1, wherein the substrate has a pattern therein defining labeling information for the battery device.

8. A battery device with integral circuit substrate packaging, comprising:

at least one energy cell; and a substrate having an integral battery circuit electrically coupled to the at least one energy cell, the substrate forming a housing for the at least one energy cell;

wherein the substrate has a main portion and an end flap attached to the main portion, the main portion covering a first portion of the at least one energy cell, and the end flap covering a second portion of the at least one energy cell.

9. The battery device of claim 8, wherein the end flap has a winged portion, and the main portion is wrapped around the at least one energy cell to capture the winged portion to help secure the end flap.

10. The battery device of claim 1, further comprising at least two energy cells, and wherein the substrate comprises a conductive pattern that provides electrical coupling between the at least two energy cells.

11. The battery device of claim 1, wherein the substrate comprises a conductive pattern that provides electrical coupling between the at least one energy cell and the integral battery circuit.

12. A battery device, comprising:

a plurality of battery cells that are electrically coupled; and a flexible film substrate having an integral battery circuit, and being electrically coupled to the plurality of battery cells, the flexible film substrate having an insulated conductive pattern partially defining the integral battery circuit, the insulated conductive pattern having a portion without insulation, the portion without insulation at least partially defining battery contacts as external electrical contacts to the battery device, the flexible film substrate substantially enveloping the plurality of battery cells and forming protective covering therefor.

13. The battery device of claim 12, wherein the flexible film substrate is adhesively attached to the plurality of battery cells.

14. The battery device of claim 12, wherein the flexible film substrate, together with the plurality of battery cells, form a substantially rigid structure.

15. The battery device of claim 12, wherein the flexible film substrate has a pattern therein defining labeling information for the battery device.

16. A device, comprising:

a battery cell pack;

a flexible film circuit carrying substrate having circuitry electrically coupled to the battery cell pack; and a plurality of external electrical contacts defined by portions of the flexible film circuit carrying substrate and supported by the battery cell pack.

17. The device of claim 16, wherein the flexible film circuit carrying substrate form folded layers around the battery cell pack.

18. The device of claim 17, wherein the circuitry comprises electrical components disposed between the folded layers of the flexible film circuit carrying substrate.

19. The device of claim 16, wherein the flexible film circuit carrying substrate has an insulated conductive pattern with portions without insulation at least partially defining the plurality of external electrical contacts.

20. The device of claim 16, wherein the flexible film circuit carrying substrate substantially envelops, and together with the battery cell pack, form a substantially rigid structure.

21. The device of claim 16, wherein the flexible film circuit carrying substrate comprises polyimide.

\* \* \* \* \*